United States Patent
Henning et al.

(10) Patent No.: US 7,696,584 B2
(45) Date of Patent: Apr. 13, 2010

(54) REDUCED LEAKAGE POWER DEVICES BY INVERSION LAYER SURFACE PASSIVATION

(75) Inventors: Jason P. Henning, Carrboro, NC (US); Allan Ward, III, Durham, NC (US)

(73) Assignee: Cree, Inc., Durham, NC (US)

( * ) Notice: Subject to any disclaimer, the term of this patent is extended or adjusted under 35 U.S.C. 154(b) by 708 days.

(21) Appl. No.: 11/462,016

(22) Filed: Aug. 2, 2006

(65) Prior Publication Data

US 2007/0018272 A1  Jan. 25, 2007

Related U.S. Application Data

(63) Continuation of application No. 11/328,550, filed on Jan. 10, 2006, which is a continuation-in-part of application No. 11/169,378, filed on Jun. 29, 2005.

(51) Int. Cl.
*H01L 29/78* (2006.01)
*H01L 21/461* (2006.01)
*H01L 21/31* (2006.01)

(52) U.S. Cl. ............... 257/411; 257/E29.104; 438/791

(58) Field of Classification Search ........... 257/411, 257/E29.104; 438/791
See application file for complete search history.

(56) References Cited

U.S. PATENT DOCUMENTS

| | | | | |
|---|---|---|---|---|
| 3,895,127 A * | 7/1975 | Comizzoli | | 438/761 |
| 3,982,267 A | 9/1976 | Henry | | |
| 4,551,353 A * | 11/1985 | Hower et al. | | 438/474 |
| 4,717,641 A * | 1/1988 | Belmont et al. | | 430/198 |
| 4,799,100 A * | 1/1989 | Blanchard et al. | | 257/490 |
| 5,332,697 A | 7/1994 | Smith et al. | | |
| 5,430,324 A | 7/1995 | Bencuya | | |
| 5,605,852 A | 2/1997 | Bencuya | | |
| 5,650,638 A * | 7/1997 | Harris et al. | | 257/77 |
| 5,776,837 A * | 7/1998 | Palmour | | 438/767 |
| 5,972,801 A | 10/1999 | Lipkin et al. | | |

(Continued)

FOREIGN PATENT DOCUMENTS

EP  1 149 934 A2  10/2001

(Continued)

OTHER PUBLICATIONS

J.J. Ganem et al, "NRA and XPS characterizations of layers formed by rapid thermal nitridation of thin 5i02 films," Nuclear Instruments and Methods in Physics Research, vol. 1364, No. 1-4, 1992, Elsevier Science Publishers, Amsterdam, NL, pp. 744-749.

(Continued)

*Primary Examiner*—Kiesha R Bryant
*Assistant Examiner*—Igwe U Anya
(74) *Attorney, Agent, or Firm*—Summa, Additon & Ashe, P.A.

(57) ABSTRACT

A semiconductor device is disclosed that includes a contact and an adjacent film on the surface of an underlying doped semiconductor material. The film has sufficient fixed charge to create an inversion layer adjacent the surface of the doped semiconductor material that under depletion conditions at least balances the number of surface states at the doping concentration of the underlying semiconductor material.

30 Claims, 2 Drawing Sheets

U.S. PATENT DOCUMENTS

| | | | |
|---|---|---|---|
| 6,001,716 A | 12/1999 | Liao | |
| 6,246,076 B1 | 6/2001 | Lipkin et al. | |
| 6,396,090 B1 | 5/2002 | Hsu et al. | |
| 6,426,542 B1 | 7/2002 | Tan | |
| 6,429,518 B1 | 8/2002 | Endo | |
| 6,437,371 B2 | 8/2002 | Lipkin et al. | |
| 6,528,373 B2 | 3/2003 | Lipkin et al. | |
| 6,586,781 B2 | 7/2003 | Wu et al. | |
| 6,610,366 B2 | 8/2003 | Lipkin | |
| 6,673,662 B2 | 1/2004 | Singh | |
| 6,767,843 B2 | 7/2004 | Lipkin et al. | |
| 6,797,586 B2 | 9/2004 | Dev | |
| 6,825,501 B2 | 11/2004 | Edmond et al. | |
| 6,849,882 B2 | 2/2005 | Chavarkar et al. | |
| 6,939,756 B1 * | 9/2005 | Chung et al. | 438/198 |
| 2001/0009788 A1 * | 7/2001 | Lipkin et al. | 438/285 |
| 2001/0028100 A1 | 10/2001 | Schmitz et al. | |
| 2001/0050369 A1 * | 12/2001 | Zeng et al. | 257/77 |
| 2002/0121641 A1 * | 9/2002 | Alok et al. | 257/76 |
| 2003/0020092 A1 | 1/2003 | Parikh et al. | |
| 2003/0025121 A1 | 2/2003 | Edmond et al. | |
| 2003/0160274 A1 | 8/2003 | Das et al. | |
| 2003/0201453 A2 | 10/2003 | Edmond | |
| 2004/0099888 A1 * | 5/2004 | Sriram | 257/288 |
| 2004/0099928 A1 | 5/2004 | Nunan et al. | |
| 2004/0159865 A1 | 8/2004 | Allen et al. | |
| 2005/0156284 A1 * | 7/2005 | Schmidt | 257/626 |
| 2005/0170574 A1 | 8/2005 | Sheppard et al. | |
| 2005/0212075 A1 * | 9/2005 | Neidig | 257/502 |
| 2005/0221628 A1 * | 10/2005 | Tanaka et al. | 438/791 |
| 2005/0258431 A1 | 11/2005 | Smith et al. | |
| 2006/0006415 A1 | 1/2006 | Wu et al. | |
| 2006/0145190 A1 | 7/2006 | Salzman et al. | |
| 2006/0157733 A1 | 7/2006 | Lucovsky et al. | |
| 2007/0001174 A1 | 1/2007 | Ring et al. | |

FOREIGN PATENT DOCUMENTS

| | | |
|---|---|---|
| TW | 471049 | 1/2002 |
| TW | 474024 | 1/2002 |
| TW | 579600 | 3/2004 |
| WO | WO 0113436 | 2/2001 |
| WO | WO 0249114 A2 * | 6/2002 |
| WO | WO 2005076365 | 8/2005 |

OTHER PUBLICATIONS

International Search Report for PCT/US2006/048817, Authorized Officer Pierre Fevre, Date of Mailing: Jun. 25, 2007; 3 pgs.

Ohno Y et al: "Effect of surface passivation on breakdown of AlGaN/Gan HEMTs," Compound Semiconductors, 2003, International Symposium, Aug. 25-27, 2003; Piscataway, NJ, pp. 169-170.

Lipkin et al., Improved Oxidation Procedures for Reduced Si02/Sic Defects; Journal of Electronic Materials; vol. 25, No. 5, 1996, pp. 909-915.

G. Y. Chung et al., Effect of Nitric Oxide Annealing on the Interface Trap Densities Near the Band Edges in the 4H Polytype of Silicon Carbide; Applied Physics Letters, vol. 76, No. 13, Mar., 2000, pp. 1713-1715.

H. F. Li et al., Improving Si02 Grown on P-Type 4H-SiC by NO Annealing; Materials Science Forum; vols. 264-268, 1998, pp. 869-872, 1998 Trans Tech Publications, Switzerland.

Lipkin et al., N2O Processing Improves the 4H-SiC:SiO2 Interface; Materials Science Forum; vols. 389-393, 2002, pp. 985-988, 2002 Trans Tech Publications, Switzerland.

ROC (Taiwan) Search Report of foreign counterpart application No. 095123557; date of completion Jan. 15, 2009; 1 pg.

* cited by examiner

REDUCED LEAKAGE POWER DEVICES BY INVERSION LAYER SURFACE PASSIVATION

RELATED APPLICATIONS

This application is a continuation in part of copending application Ser. No. 11/328,550 filed Jan. 10, 2006, which in turn is a continuation in part of Ser. No. 11/169,378 filed Jun. 29, 2005. The contents of these applications are incorporated entirely herein by reference.

BACKGROUND

The present invention relates to power devices, and in particular relates to minimizing reverse leakage current in such devices in wide bandgap semiconductor materials.

Power semiconductor devices operate at high voltage and thus in the presence of, or otherwise generate or experience, high electric fields. Such devices typically include, but are not necessarily limited to Schottky (rectifying) diodes, metal-oxide semiconductor field-effect transistors (MOSFETs); insulated gate bipolar transistors (IGBTs); PIN diodes; bipolar junction transistors (BJTs). For example (but not as a limitation), SiC-based power devices are advantageous for (switching) power supplies, motor control, power conditioning, hybrid vehicle technology, safety equipment, and power storage.

For electronic power devices, silicon carbide offers a number of physical, chemical and electronic advantages. Physically, the material is very hard and has an extremely high melting point, giving it robust physical characteristics. Chemically, silicon carbide is highly resistant to chemical attack and thus offers chemical stability as well as thermal stability. Perhaps most importantly, however, silicon carbide has excellent electronic properties, including high breakdown field, a relatively wide band gap (about 2.9 eV at room temperature for the 6H polytype), high saturated electron drift velocity, giving it significant advantages with respect to high power operation, high temperature operation, radiation hardness, and absorption and emission of high energy photons in the blue, violet, and ultraviolet regions of the spectrum.

As another wide bandgap material, gallium nitride offers similar advantages. It has a wide bandgap (about 3.4 eV at room temperature), high thermal conductivity, a high melting point, a low dielectric constant and a high breakdown voltage.

For power applications, silicon carbide's wide bandgap results in a high impact ionization energy. In turn, this allows SiC to experience relatively high electric fields without avalanche multiplication of ionized carriers. By way of comparison, silicon carbide's electric field capacity is about ten times as great as that of silicon.

Because the active regions of these devices experience or generate such high electric fields, the devices typically must include some sort of termination structure to lessen the effects of the field ("field crowding") at the edge of the device. In common examples, the termination structure includes implanted regions in the silicon carbide adjacent the active region. Because the surface of the device must also be terminated, some sort of passivation structure is typically added to this surface. In most cases, the surface passivation structure can include a polymer (frequently polyimide) or a dielectric passivation such as silicon oxide, silicon nitride, or some combination of these, including non-stoichiometric oxides and non-stoichiometric nitrides (i.e., other than $SiO_2$ and $Si_3N_4$).

Reverse leakage current in power diodes, particularly Schottky (rectifying) diodes, is a source of power loss that in turn reduces system efficiency and increases the operating temperature of a power device. Although several mechanisms can contribute to reverse leakage current, one source includes surface generation of carriers outside of the active region of the device. Although a proportionally small part of the device, the region of the diode between the termination structure and the edge of the physical die appears to contribute significantly to reverse bias leakage. Under certain conditions, this leakage mechanism appears to be dominated by surface generation. For example, in the presence of an oxide-semiconductor interface and a depletion condition, surface recombination-generation centers will generate a significant number of carriers that will in turn result in an increased leakage current.

As noted above, power diodes typically include some form of surface passivation or termination, but these typically fail to address the surface-generated leakage mechanism that tends to occur under depletion conditions. Similarly, the surface of a device (i.e., its overall size) could theoretically be expanded to proportionally minimize surface effects, but the resulting decrease in yield (fewer devices per wafer) and increased cost would be disproportionally unfavorable compared to the minimal affect on leakage current.

Accordingly, surface-generated carriers that are produced under depletion conditions represents a problem that exhibits itself as reverse leakage current.

SUMMARY

In one aspect the invention is a semiconductor device comprising a contact and an adjacent film on the surface of an underlying doped semiconductor material in which the film has sufficient fixed charge to create an inversion layer adjacent the surface of the doped semiconductor material that under depletion conditions at least balances the number of surface states at the doping concentration of the underlying semiconductor material.

In another aspect the invention is a semiconductor diode comprising a rectifying metal contact and an adjacent film on the surface of an underlying doped semiconductor material. The film has sufficient fixed charge to create an inversion layer adjacent the surface of the doped semiconductor material that under depletion conditions at least balances the number of surface states at the doping concentration of the underlying semiconductor material.

In another aspect the invention is a Schottky diode. The diode includes a doped semiconductor layer selected from the group consisting of silicon carbide and Group III nitride, a rectifying metal contact on the doped semiconductor layer, an ohmic contact to the doped semiconductor layer, a passivation layer adjacent the rectifying metal contact on the doped semiconductor layer, and sufficient fixed charge in the passivation layer to create an inversion layer adjacent the surface of the semiconductor layer in which the inversion layer at least balances the number of surface states at the doping concentration of the doped semiconductor layer.

In yet another aspect, the invention is a method of reducing leakage current during operation of a power diode in wide bandgap semiconductor materials. The method includes the steps of applying a voltage to a contact on a doped semiconductor layer sufficient to create a depletion region that extends adjacent the edge of the diode, in the presence of a fixed charge above the doped semiconductor layer adjacent the edge of the diode from a passivation layer on the doped semiconductor. The passivation layer carries a fixed charge that induces an inversion layer that is sufficient to prevent the depletion region from creating excess generation sites that would otherwise increase leakage current and to thereby dominate leakage by bulk generation rather than surface generation.

In yet another aspect, the invention is a method of reducing leakage current in a metal-semiconductor rectifying diode. In this aspect the method includes adding a film to a doped semiconductor surface adjacent to a rectifying metal contact.

The film includes sufficient fixed charge to create an inversion layer in the semiconductor that at least balances the number of surface states based upon the doping concentration of the semiconductor material.

The foregoing and other objects and advantages of the invention and the manner in which the same are accomplished will become clearer based on the followed detailed description taken in conjunction with the accompanying drawings.

DETAILED DESCRIPTION

The invention provides advantages in reducing leakage caused by edge termination surface effects in power diodes. Much of the description herein will be in terms of Schottky diodes, but the advantages are not limited to Schottky diodes. In general, Schottky diodes are well understood, including those formed using wide bandgap semiconductors such as silicon carbide and the Group III nitrides. In addition to numerous individual sources, general and specific structures and manufacturing techniques are set forth in exemplary sources such as Zetterling, PROCESS TECHNOLOGY FOR SILICON CARBIDE DEVICES, The Institute of Electrical Engineers (London, United Kingdom, 2002); Sze, PHYSICS OF SEMICONDUCTOR DEVICES, Second Edition (1981) John Wiley & Sons, Inc.; Sze, MODERN SEMICONDUCTOR DEVICE PHYSICS (1998) John Wiley & Sons, Inc.; and Dorf, THE ELECTRICAL ENGINEERING HANDBOOK, Second Edition, CRC Press (1997)

It will be understood, however, the that the invention is applicable to any structure in which surface recombination events generate leakage current under depletion conditions. This can, of course, include semiconductor p-n junction devices and field effect transistors (FETs) in addition to the metal-semiconductor (Schottky) junctions described herein. The cited references likewise offer helpful descriptions of such devices and their operation.

The present invention is a semiconductor diode comprising a rectifying structure and an adjacent film on the surface of the underlying doped semiconductor material in which the film has sufficient fixed charge to create an inversion layer adjacent the surface of the doped semiconductor material that at least balances the number of surface states at the doping concentration of the underlying semiconductor material.

Figure 1:
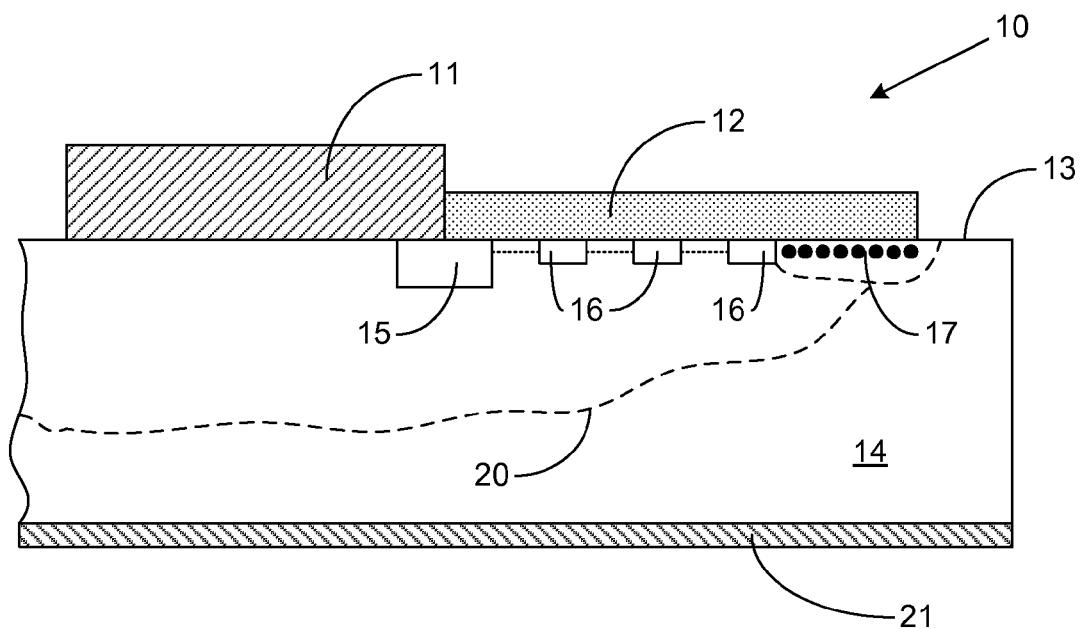
FIG. 1 is a schematic cross sectional view of a Schottky diode that incorporates the present invention.

FIG. 1 illustrates the invention in the context of a Schottky diode. The diode is broadly designated at 10 and includes the rectifying metal contact 11 and an adjacent film 12 on the surface 13 of an underlying doped semiconductor material 14. As noted above, the various designs of Schottky diodes are generally well understood in the art and it thus will be understood that FIG. 1 is exemplary of one particular type of design rather than limiting of the invention. Thus, FIG. 1 also illustrates an implanted well 15 of opposite conductivity type from the doped semiconductor 14th. The presence of the doped well and associated depletion region can help control the field effects at the edge of the metal contact 11. A set of opposite-conductivity guard rings 16 also helps avoid leakage generated at the metal-semiconductor interface Because the film 12 carries sufficient fixed charge, it creates an inversion layer illustrated by the dots 17 which will generally be the minority carriers in the doped layer 14. Thus, if the doped layer 14 is n-type, the inversion layer 17 will be formed of holes and if the doped portion 14 is p-type, the inversion layer 17 will be electrons.

In the absence of the inversion layer 17, when the diode 10 is depleted (symbolized by the dotted line 20) the effects of the depletion at the semiconductor surface 13 will generate a significant amount of carriers from surface recombination-generation centers that result in increased leakage current.

With the inversion layer 17 present, however, the surface trapped recombination-generation centers are passivated by the carriers in the inversion layer 17 thus significantly reducing the generation current. The effect is generally analogous to the state of a gate-controlled diode under sufficient voltage to create such an inversion layer.

Stated differently, when sufficient fixed charge is present in the film 12, the film 12 can create the inversion layer 17 even in the absence of a gate or an applied voltage.

When the leakage current generated by such surface recombinations is minimized or eliminated, the overall leakage current will be dominated by bulk generation in the depletion region and field emission near the metal barrier. These effects are, however, much more moderate than the surface effects, thus resulting in an overall reduction in leakage current.

In typical embodiments, it is been discovered that the passivation structures described in commonly assigned, copending, and previously incorporated parent application Ser. Nos. 11/169,378 and 11/328,550 can provide the appropriate fixed charge. As set forth in those applications, the film 12 is a passivation structure comprising an oxidation layer (typically a thermal oxidation for a silicon carbide semiconductor), a first sputtered non-stoichiometric silicon nitride layer on the oxidation layer, and a stoichiometric silicon nitride layer on the nonstoichiometric silicon nitride layer.

Figure 2:
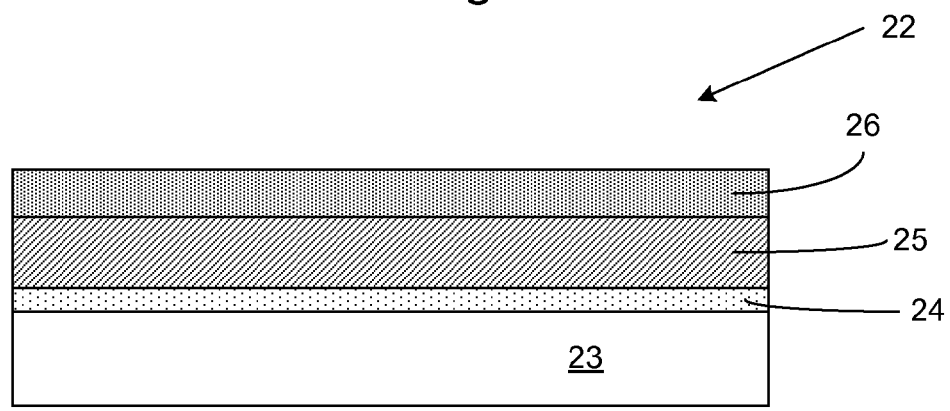
FIG. 2 is a schematic cross sectional view illustrating a passivation structure according to the present invention.

FIG. 2 shows a semiconductor structure broadly designated at 22 in cross sectional schematic fashion. In this embodiment, the structure includes a silicon carbide substrate (or layer) 23 with an oxidation layer 24, typically a thermally-generated layer of silicon dioxide, on the silicon carbide substrate 23. It will be understood that the term "substrate" is descriptive and explanatory of the silicon carbide portion 23 rather than limiting. Thus, the silicon carbide substrate 23 can be a wafer or wafer precursor, or can be a functional layer positioned upon other supporting structures (not shown).

The thermal oxidation layer 24 lowers the interface density between the silicon carbide substrate 23 and the thermal oxidation layer 24 and thus enhances the operation of the resulting devices formed from or incorporating the structure 22.

The embodiment illustrated in FIG. 2 shows a sputtered silicon nitride portion 25 and a plasma enhanced chemical vapor deposited (PECVD) layer of silicon nitride 26. Although the invention can be broadly described in this manner, additional advantages are schematically illustrated in FIG. 3.

Figure 3:
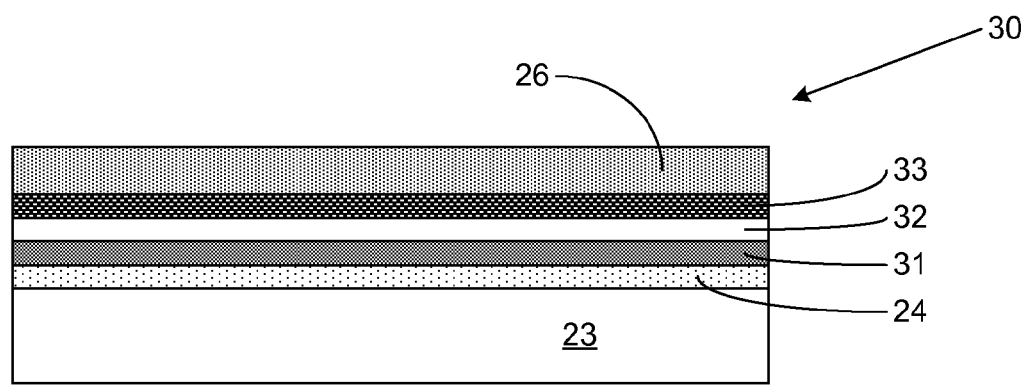
FIG. 3 is a schematic cross sectional view illustrating a second passivation structure according to the present invention.

FIG. 3 shows the structure broadly designated at 30. The structure 30 again includes the silicon carbide substrate 23 and the thermal oxide 24.

It will be understood that as used herein and as is common in the semiconductor art, past tense terms such as, "oxidized," "sputtered," and "chemical vapor deposited," are used as adjectives as well as verbs. Thus, they describe structures which are well understood in this art and the context of their use will be clear herein.

In FIG. 3, a first sputtered nonstoichiometric layer 31 is on the thermal oxidation layer 24 for reducing parasitic capacitance and minimizing device trapping. A second sputtered non-stoichiometric silicon nitride layer 32 is on the first layer 31 for positioning subsequent passivation layers further from the substrate 23, but without fully encapsulating the structure 22. A sputtered stoichiometric silicon nitride layer 33 is on the second sputtered nonstoichiometric layer 32 for initially encapsulating the structure 22 and for enhancing the hydrogen barrier properties of the passivation layers. The chemical vapor deposited environmental barrier layer, again labeled at 26, covers the device to provide step coverage and crack prevention.

In somewhat greater detail, the thermal oxidation layer 24 is stoichiometric silicon dioxide ($SiO_2$) with a thickness in exemplary embodiments of between about 100 and 500 angstroms (Å). This is a sufficient thickness to provide the electronic benefits of the oxide (as opposed to a nitride-only passivation), but less than a thickness that would raise additional manufacturing problems.

As set forth elsewhere herein, the nature of sputtering is such that it provides a silicon nitride layer that is substantially hydrogen-free. Thus layers 31, 32 and 33 are advantageously substantially hydrogen free.

The first two sputtered layers 31 and 32 are preferentially nitrogen-rich. As well understood in this art, the proportion of silicon or nitrogen (in a non-stoichiometric composition) can be determined by the refractive index, which is an indicator of the composition of the formed silicon nitride film. A silicon nitride film having a substantially stoichiometric composition has a refractive index of 2.02 measured at 6328 Å.

Silicon rich nitride has an atomic ratio of silicon to nitrogen that is greater than 3:4 (i.e., stoichiometric silicon nitride is $Si_3N_4$). A typical silicon rich nitride will have an index of refraction of greater than 2.02 measured at 6328 Å and a nitrogen rich film will have an index of refraction lower than 2.02 measured at 6328 Å.

Accordingly, in exemplary embodiments each of the non-stoichiometric sputtered silicon nitride layers 31 and 32 have a refractive index of between about 1.85 and 1.95.

One purpose of sputtering is to avoid the presence of hydrogen as described elsewhere herein, and to correspondingly avoid the electronic problems associated with the presence of hydrogen. Accordingly, the sputtered layers described with respect to FIGS. 2 and 3 can also be understood as hydrogen-free layers. Stated differently, sputtering is one technique for producing a hydrogen-free passivation layer. The invention, however, can also be understood as the hydrogen free passivation layer regardless of its method of manufacture.

The invention is useful in the context of wide-bandgap semiconductor materials and thus the doped semiconductor material 14 can be n-type or p-type silicon carbide or a Group III nitride, particularly gallium nitride (GaN) for power devices.

When the semiconductor material 14 is n-type silicon carbide, the rectifying metal can be selected by those of ordinary skill in this art without undue experimentation, particularly referring to the sources cited earlier among others. Exemplary, but not limiting choices for the rectifying metal contact to n-type silicon carbide include nickel, titanium, platinum, aluminum, chromium, combinations of these metals, and alloys of these metals.

For p-type silicon carbide, exemplary rectifying metals include nickel, gold, titanium, titanium-tungsten, and combinations and alloys thereof.

When the doped semiconductor material is an n-type Group III nitride (particularly GaN), the rectifying metal contact can likewise be selected by those of skill in the art with exemplary choices including, but not limited to, titanium, platinum, chromium, titanium-tungsten, and platinum-silicide.

When the doped semiconductor material 14 is p-type Group III nitride, the rectifying metal contact can be selected from the exemplary group consisting of titanium, platinum, chromium, titanium-tungsten, and platinum-silicide.

The amount of fixed charge required to create the inversion layer 17 in the doped semiconductor material 14 can be determined by those of ordinary skill in this art without undue experimentation. As an example, when the doped semiconductor material 14 is silicon carbide, power devices will generally have n-type carrier concentrations of between about 1E15 and 1E16 ($1\times10^{15}$ cm$^{-3}$ and $1\times10^{16}$ cm$^{-3}$). In such cases, the passivation layer should have a fixed charge of between about 1E10 and 1E13 cm$^{-2}$ to create the inversion layer. As noted elsewhere herein, the distance between the fixed charge and the semiconductor surface will also affect the inversion layer and thus the fixed charge can be moderated accordingly. The device doping will, of course depend upon the desired blocking voltage of the device. Exemplary commercial devices with blocking voltages of 600 volts and 1200 volts have carrier concentrations of 5E15 and 2E15 respectively.

FIG. 1 also illustrates an ohmic contact 21 to complete the diode 10. Ohmic contacts and their function are likewise well understood in this art and need not be described in detail. Exemplary ohmic contact metals for silicon carbide include nickel-chromium, platinum-silicide, aluminum-titanium, nickel, chromium, tungsten, titanium carbide, titanium, and combination and alloys thereof. A useful discussion of both Schottky and ohmic contacts with respect to silicon carbide is set forth in Chapter 6 of Zetterling, supra and demonstrates that the selection of the metals for such contacts is well within the knowledge of the person of ordinary skill in this art and that those practicing this invention can do so without undue experimentation.

When the doped semiconductor material 14 is a Group III nitride, particularly gallium nitride, the ohmic metal contact can likewise be selected without undue experimentation with exemplary metals including gold, gold-tin, zinc, gold-zinc, gold-nickel, platinum, nickel, and combinations thereof.

In addition to the structures set forth in the incorporated copending applications, the passivation layer can also be selected from the group consisting of oxide films, silicon dioxide, borophosphosilicate glass, tetraethyloxysilicate borophosphosilicate glass, silicon nitride, and combinations thereof.

Figure 4:
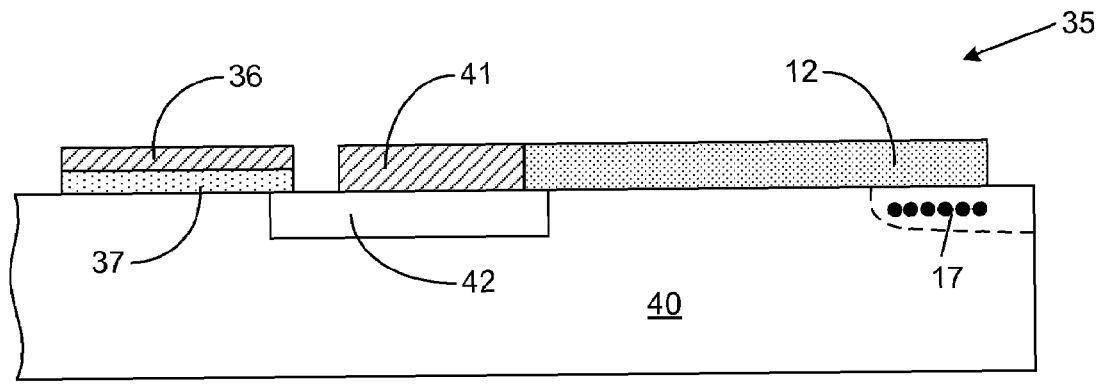
FIG. 4 is schematic cross sectional view of a MOSFET that incorporates the present invention.
Figure 5:
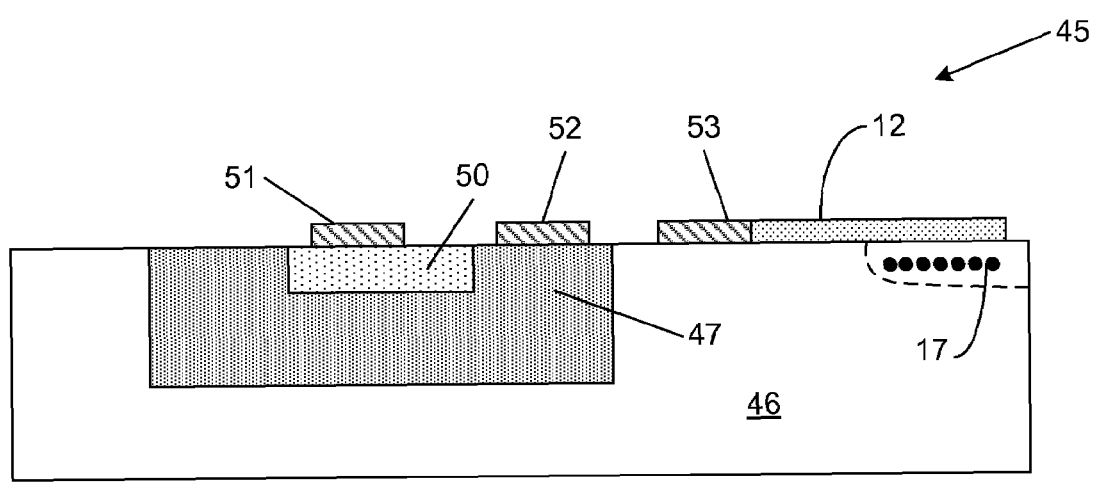
FIG. 5 is schematic cross sectional view of a BJT that incorporates the present invention.

FIGS. 4 and 5 illustrate the invention in the context of other power devices. FIG. 4 is a schematic partial cross-sectional view of a metal oxide semiconductor field effect transistor (MOSFET) broadly designated at 35. The MOSFET 35 includes a source contact and source region (not shown), the gate contact 36, the gate oxide 37, the channel region 40 and a drain contact 41 to the opposite conductivity drain portion 42 of the device 35. The film carrying a fixed charge is again labeled at 12 consistent with the other drawings. As in the other drawings, the layer 12 carries a fixed charge sufficient to create the inversion layer 17 at the edge of the device and minimize leakage current.

FIG. 5 is a cross-sectional schematic diagram of a bipolar junction transistor broadly designated at 45 which as illustrated includes an n-type portion 46 a p-type portion 47 and another n-type portion 50. The transistor includes an emitter contact 51, a base contact 52, and a collector contact 53. The fixed charge carrying film is again labeled at 12 and creates the inversion layer 17 in the n-type portion 46.

It will be understood that the relative dimensions of the various items in FIGS. 4 and 5 are for illustration purposes. Thus, actual devices can have relative proportions quite different from those illustrated in FIGS. 4 and 5, but will otherwise operate in the indicated fashion.

In another aspect, the invention is a method of reducing leakage current during operation of a power diode in wide bandgap semiconductor materials. In this aspect, the method comprises applying a voltage to a contact on a doped semiconductor layer sufficient to create a depletion region that extends adjacent the edge of the diode in the presence of a fixed charge above the doped semiconductor layer adjacent edge of the diode. The fixed charge is carried by a passivation layer on the doped semiconductor. The fixed charge induces an inversion layer that is sufficient to prevent the depletion region from creating excess generation sites that would otherwise increase leakage current. As a result, bulk generation rather than surface generation dominates leakage.

Because leakage from bulk generation tends to be much less than leakage from surface recombination-generation, the net effect is to reduce leakage current during diode operation.

In another aspect, the invention is a method of reducing leakage current in a rectifying diode comprising adding a film to a doped semiconductor surface adjacent to a rectifying structure in which the film includes sufficient fixed charge to create an inversion layer in the semiconductor that under depletion at least balances the number of surface states based upon the doping concentration of the semiconductor material.

In one embodiment, the step of adding the film comprises adding an oxide film to the doped semiconductor surface adjacent to a rectifying metal contact and thereafter producing and fixing charges in the oxide. The fixed charges are obtained (or moderated in amount) using a step selected from the group consisting of exposing the oxide to a plasma containing hydrogen and nitrogen (e.g., ammonia, $NH_3$) or implanting the oxide with hydrogen or nitrogen. In this aspect, the method can further comprise the step of annealing the oxide to laterally diffuse the fixed charges to the desired extent depending upon the geometry of the device.

In another aspect, the step of adding the film can comprise moderating the number of fixed-charge items in the film. These items are selected from the group consisting of native ions and point defects to thereby produce a sufficient fixed charge. Although the observed effects are somewhat empirical, it is generally well understood that point defects will act "opposite" from the missing material, so that a missing negative ion in a crystal structure will create a point defect that acts as a positive charge and vice versa.

In another aspect, the step of adding the film comprises moderating the grain structure of the film to produce a sufficient fixed charge. Although the inventors do not wish to be bound by any theory, it appears that decreasing the grain size tends to increase the fixed charge because of a proportionally greater number of defects.

In another aspect, the step of adding the film comprises adding a silicon nitride film and obtaining the sufficient fixed charge by moderating the relative amounts of silicon and nitrogen in the film. Again, without being bound by any theory, it appears that substitutional silicon in silicon nitride tends to increase the positive fixed charge while interstitial silicon tends to increase the negative fixed charge.

The amount of nitrogen tends to behave in the opposite matter; i.e. substitutional nitrogen tends to decrease positive fixed charge, and interstitial nitrogen tends to decrease negative fixed charge.

In another aspect, the method can comprise moderating the thickness of the film to thereby obtained a sufficient fixed charge. When the film is applied using plasma enhanced chemical vapor deposition (as described in the incorporated parent applications), the resulting film tends to have a high fixed charge. Thus, increasing the thickness of the sputtered layer tends to lower the effect of fixed charge by moving the higher fixed charge geometrically further from the surface of the doped semiconductor material. Similarly, decreasing the thickness of the sputtered layer tends to increase the effect of the fixed charge for the same reason. The sputtered layer, of course, also carries its own fixed charge.

In yet another aspect, the step of adding the film can comprise including species in the film that carry the desired fixed charge. Although the term "doping" is not usually used in this context, the step is analogous in that specific species are included in the film to produce a fixed charge of the desired concentration in the layer.

As another potential technique it if recognized that the charge density decreases when oxidation temperature increases and that charge density further decreases when an oxidized silicon wafer is annealed in an ambient of an inert gas such as argon or nitrogen (see U.S. Pat. No. 5,683,513, internal citations omitted). Other research indicates that the charge density increases by the presence of dry oxygen in the inert gas (id).

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A semiconductor device comprising an edge termination structure and an adjacent passivation layer on the surface of an underlying doped semiconductor material in which said passivation layer has sufficient fixed charge to create an inversion layer adjacent the surface of said doped semiconductor material in the absence of a gate or applied voltage, that under depletion conditions at least balances the number of surface states at the doping concentration of the underlying semiconductor material.

2. A semiconductor device according to claim 1 wherein said device comprises a p-n junction device.

3. A semiconductor device according to claim 1 wherein said device comprises a Schottky diode.

4. A semiconductor device according to claim 1 wherein said device comprises a field effect transistor.

5. A semiconductor diode comprising a metal contact and an adjacent passivation layer on the surface of an underlying doped semiconductor material in which said passivation layer has sufficient fixed charge to create an inversion layer adjacent the surface of said doped semiconductor material in the absence of a gate or applied voltage, that under depletion conditions at least balances the number of surface states at the doping concentration of the underlying semiconductor material.

6. A diode according to claim 5 wherein said passivation layer is selected from the group consisting of oxide films, silicon dioxide, borophosphosilicate glass, tetraethyloxysilicate borophosphosilicate glass, silicon nitride, and combinations thereof.

7. A diode according to claim 5 wherein said passivation layer comprises an oxidation layer; a first sputtered non-stoichiometric silicon nitride layer on said oxidation layer; and a stoichiometric silicon nitride layer on said non-stoichiometric silicon nitride layer.

8. A diode according to claim 5 wherein said underlying doped semiconductor material comprises n-type silicon carbide.

9. A diode according to claim 8 wherein said metal contact is a rectifying contact selected from the group consisting of nickel (Ni), titanium (Ti), platinum (Pt), aluminum (Al), chromium (Cr), combinations thereof and alloys thereof.

10. A diode according to claim 5 wherein said underlying doped semiconductor material comprises p-type silicon carbide.

11. A diode according to claim 10 wherein metal contact is a rectifying contact selected from the group consisting of nickel, gold, titanium, titanium-tungsten, and combinations thereof.

12. A diode according to claim 5 wherein said underlying doped semiconductor material comprises n-type Group III nitride.

13. A diode according to claim 12 wherein said metal contact is a rectifying contact selected from the group consisting of titanium, platinum, chromium, titanium-tungsten, and platinum-silicide.

14. A diode according to claim 5 wherein said underlying doped semiconductor material comprises p-type Group III nitride.

15. A diode according to claim 14 wherein said rectifying metal contact is selected from the group consisting of titanium, platinum, chromium, titanium-tungsten, and platinum-silicide.

16. A diode according to claim 5 wherein:
said doped semiconductor material comprises silicon carbide;
said silicon carbide has a carrier concentration of between about 1E15 and 1E16; and
said passivation layer has a fixed charge concentration of between about 1E10 and 1E13 cm-2.

17. A Schottky diode comprising:
a doped semiconductor layer selected from the group consisting of silicon carbide and Group III nitride;
a rectifying metal contact on said doped semiconductor layer;
an ohmic contact to said doped semiconductor layer;
a passivation layer adjacent said rectifying metal contact on said doped semiconductor layer; and
sufficient fixed charge in said passivation layer to create an inversion layer adjacent the surface of said semiconductor layer in the absence of a gate or applied voltage, in which the inversion layer at least balances the number of surface states at the doping concentration of said doped semiconductor layer.

18. A Schottky diode according to claim 17 wherein said doped semiconductor layer comprises silicon carbide and said ohmic metal contact is selected from the group consisting of nickel-chromium, platinum silicide, aluminum-titanium, nickel, chromium, tungsten, titanium carbide, titanium, and combinations thereof.

19. A Schottky diode according to claim 17 herein said doped semiconductor layer comprises a Group III nitride and said ohmic metal contact is selected from the group consisting of gold, gold-tin, zinc, gold-zinc, gold-nickel, platinum, nickel, and combinations thereof.

20. A Schottky diode according to claim 17 wherein said passivation layer is selected from the group consisting of oxide films, silicon dioxide, borophosphosilicate glass, tetra-ethyloxysilicate borophosilicate glass, silicon nitride, and combinations thereof.

21. A Schottky diode according to claim 17 wherein said passivation layer comprises an oxidation layer; a first sputtered non-stoichiometric silicon nitride layer on said oxidation layer; and a stoichiometric silicon nitride layer on said non-stoichiometric silicon nitride layer.

22. A method of reducing leakage current during operation of a power diode in wide bandgap semiconductor materials, the method comprising;
applying a voltage to a contact on a doped semiconductor layer sufficient to create a depletion region that extends adjacent the edge of the diode;
in the presence of a fixed charge above the doped semiconductor layer adjacent the edge of the diode from a passivation layer on the doped semiconductor in which the passivation layer carries a fixed charge that induces an inversion layer in the absence of a gate or applied voltage, that is sufficient to prevent the depletion region from creating excess generation sites that would otherwise increase leakage current and to thereby dominate leakage by bulk generation rather than surface generation.

23. A method of reducing leakage current in a metal-semiconductor rectifying diode, the method comprising:
adding a passivation layer to a doped semiconductor surface adjacent to a rectifying metal contact in which the passivation layer includes sufficient fixed charge to create an inversion layer in the semiconductor in the absence of a gate or applied voltage, that at least balances the number of surface states at the doping concentration of the semiconductor material.

24. A method according to claim 23 wherein the step of adding the passivation layer comprises:
adding an oxide film to the doped semiconductor surface adjacent to the rectifying metal contact; and
thereafter producing and fixing charges in the oxide by a step selected from the group consisting of exposing the oxide to a plasma containing hydrogen and nitrogen and implanting the oxide with hydrogen or nitrogen.

25. A method according to claim 24 further comprising the step of annealing the oxide to laterally diffuse the fixed charges.

26. A method according to claim 23 wherein the step of adding the passivation layer comprises moderating the number of items in the passivation layer selected from the group consisting of native ions and point defects to thereby produce the sufficient fixed charge.

27. A method according to claim 23 wherein the step of adding the passivation layer comprises moderating the grain structure of the passivation layer to thereby produce the sufficient fixed charge.

28. A method according to claim 23 wherein the step of adding the passivation layer comprises adding a silicon nitride film and obtaining the sufficient fixed charge by moderating the relative amounts of silicon and nitrogen in the film.

29. A method according to claim 23 comprising moderating the thickness of the passivation layer to thereby obtained the sufficient fixed charge.

30. A method according to claim 23 wherein the step of adding the passivation layer comprises including species with fixed charge into the passivation layer.

* * * * *

UNITED STATES PATENT AND TRADEMARK OFFICE
CERTIFICATE OF CORRECTION

PATENT NO. : 7,696,584 B2 Page 1 of 1
APPLICATION NO. : 11/462016
DATED : April 13, 2010
INVENTOR(S) : Jason P. Henning and Allan Ward, III It is certified that error appears in the above-identified patent and that said Letters Patent is hereby corrected as shown below:

Title Page, Item (56) OTHER PUBLICATIONS:

delete:

"J. J. GANEM et al, "NRA and XPS characterization of layers formed by rapid thermal nitridation of thin 5i02 films," Nuclear Instruments and Methods in Physics Research, Vol. 1364, No. 1-4, 1992, Elsevier Science Publishers, Amsterdam, NL, pp 744-749"

and insert:

-- J. J. GANEM et al, "NRS and XPS characterization of layers formed by rapid thermal nitridation of thin Si0$_2$ films," Nuclear Instruments and Methods in Physics Research, Vol. 1364, No. 1-4, 1992, Elsevier Science Publishers, Amsterdam, NL, pp 744-749 --

Signed and Sealed this

First Day of June, 2010

David J. Kappos
*Director of the United States Patent and Trademark Office*